(12) United States Patent
Chang (10) Patent No.: US 7,335,583 B2
(45) Date of Patent: Feb. 26, 2008

(54) ISOLATING SEMICONDUCTOR DEVICE STRUCTURES

(75) Inventor: Peter L. D. Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 149 days.

(21) Appl. No.: 10/956,320

(22) Filed: Sep. 30, 2004

(65) Prior Publication Data

US 2006/0073694 A1  Apr. 6, 2006

(51) Int. Cl.
*H01L 1/3205* (2006.01)
(52) U.S. Cl. .................. 438/618; 438/587; 438/599
(58) Field of Classification Search ............ 438/618, 438/587, 599
See application file for complete search history.

(56) References Cited

U.S. PATENT DOCUMENTS

| | | | | |
|---|---|---|---|---|
| 4,997,785 A * | 3/1991 | Pfiester | ................. | 438/153 |
| 5,308,782 A * | 5/1994 | Mazure et al. | ........... | 438/154 |
| 5,482,871 A * | 1/1996 | Pollack | ................. | 438/151 |
| 5,541,130 A * | 7/1996 | Ogura et al. | ............. | 438/257 |
| 6,027,983 A * | 2/2000 | Hashimoto et al. | ...... | 438/426 |
| 6,091,129 A * | 7/2000 | Cleeves | ................. | 257/510 |
| 6,340,611 B1 * | 1/2002 | Shimizu et al. | .......... | 438/201 |
| 6,611,024 B2 * | 8/2003 | Ang et al. | ............... | 257/350 |
| 6,638,822 B2 * | 10/2003 | Chang | ................... | 438/257 |
| 6,653,240 B2 * | 11/2003 | Crawford | ............... | 438/712 |
| 6,855,608 B1 * | 2/2005 | Ramsbey et al. | ........ | 438/287 |
| 2004/0007721 A1 * | 1/2004 | Forbes et al. | ............ | 257/204 |
| 2004/0142547 A1 * | 7/2004 | Chang | ................... | 438/587 |
| 2005/0073671 A1 | 4/2005 | Borodovsky | | |
| 2005/0074698 A1 | 4/2005 | Borodovsky | | |
| 2005/0083497 A1 | 4/2005 | Borodovsky | | |
| 2005/0085085 A1 | 4/2005 | Borodovsky | | |
| 2005/0088633 A1 | 4/2005 | Borodovsky | | |

* cited by examiner

*Primary Examiner*—Steven Loke
*Assistant Examiner*—David Goodwin (57) ABSTRACT

An array of continuous diffusion regions and continuous gate electrode structures is formed over a semiconductor substrate. Interconnecting diffusion region portions and interconnecting gate electrode portions are removed to electrically isolate transistor circuitry. The removal of interconnecting diffusion region portions and gate electrode portions can be performed sequentially, at substantially the same time, and before or after forming source/drain contacts.

15 Claims, 8 Drawing Sheets

ISOLATING SEMICONDUCTOR DEVICE STRUCTURES

FIELD OF THE INVENTION

Embodiments of the present invention relate generally to semiconductor processing and more specifically to methods for isolating semiconductor structures.

BACKGROUND OF THE INVENTION

Figure 1:
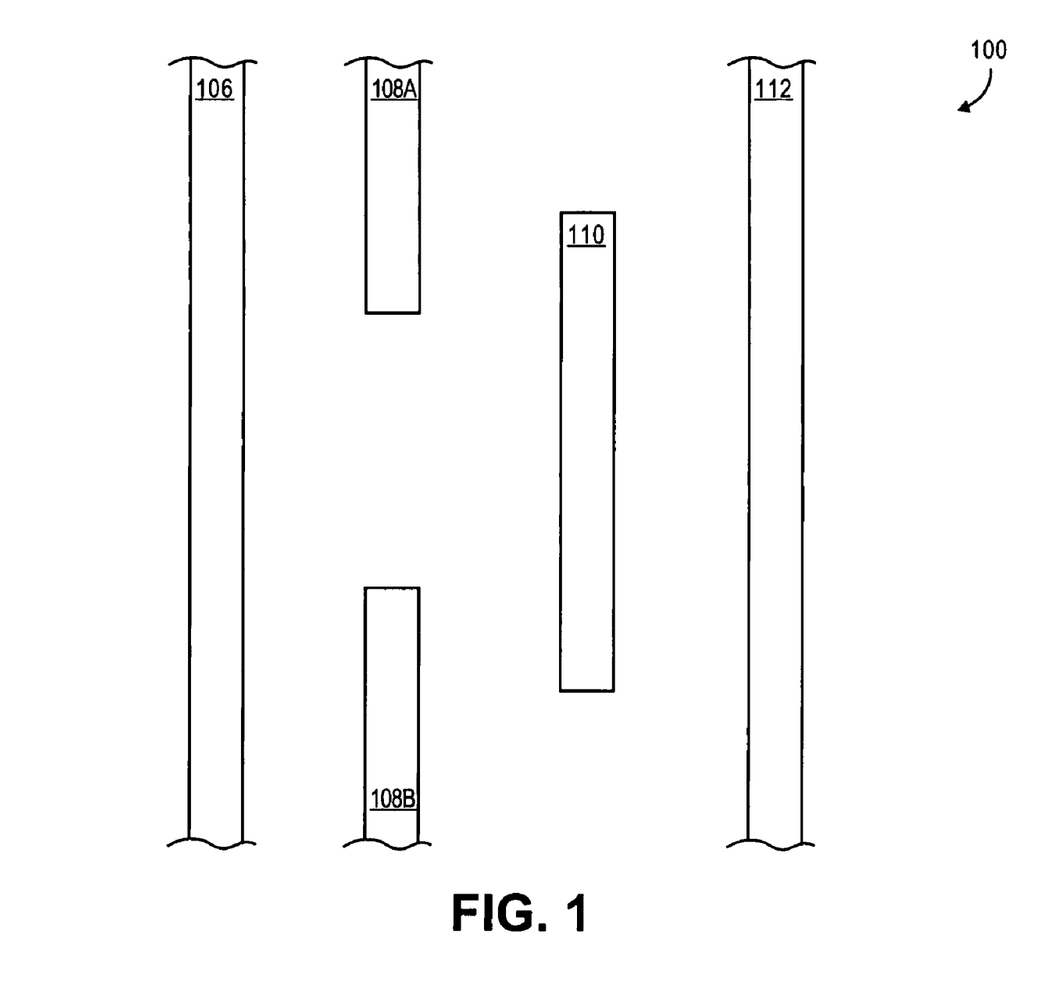
FIG. 1 illustrates a top-down view of discrete diffusion regions formed over or within a semiconductor substrate.
Figure 2:
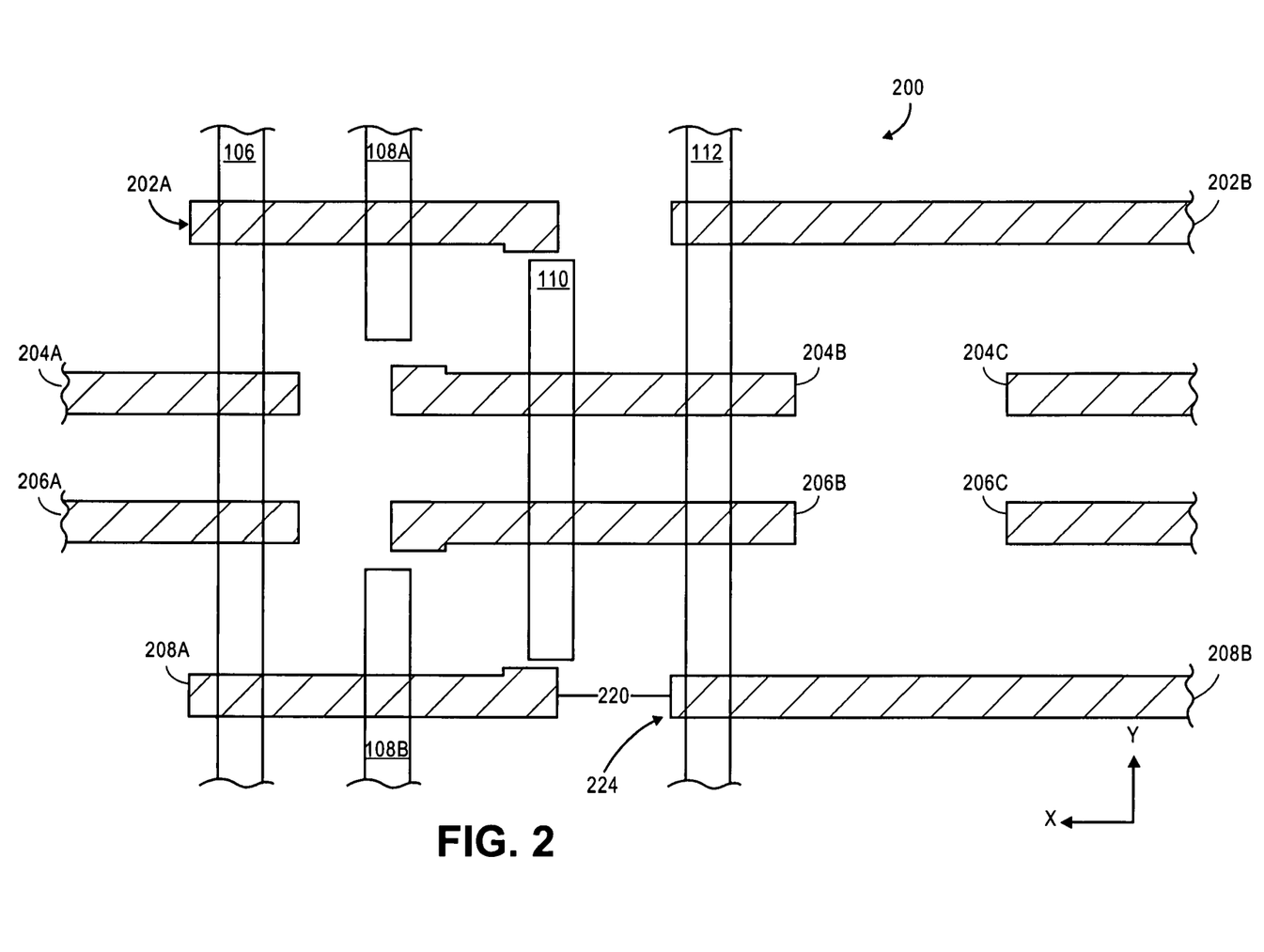
FIG. 2 illustrates the substrate of FIG. 1 after forming discrete gate electrodes over the discrete diffusion regions.

In conventional semiconductor processing, discrete diffusion regions are typically formed in a semiconductor substrate and then discrete gate electrodes structures are aligned and patterned relative to them. For example, referring to FIG. 1, which shows a top-down view of a partially fabricated semiconductor device 100, discrete patterned diffusion regions 106, 108A, 108B, 110, and 112, are formed in/over a semiconductor substrate 114. Then, as shown in FIG. 2, discrete patterned gate electrode structures 202A, 202B, 204A, 204B, 204C, 206A, 206B, 206C, 208A and 208B are aligned and perpendicularly patterned to the discrete patterned diffusion regions.

Proper x-axis and y-axis alignment of gate electrodes relative to the diffusion regions is an important consideration with respect to transistor operation and yield. For example, an inability to align the gate electrode 208B (in FIG. 2) to the diffusion region 112 along the x-axis could result in problems with the poly end cap 224 not extending completely over the diffusion region 112. To the extent that misalignment is severe, transistor operation, reliability and yield can all be affected.

One possible solution for reducing the occurrence of gate electrode/diffusion region misalignment includes increasing the length of the gate electrode 208B to insure that more of poly end cap 224 is available to overlap the diffusion region 112. However, this solution may be undesirable because it imposes a limit on the ultimate scalability of the device. In other words, to the extent that gate electrodes lengths are increased, spaces 220 between adjacent gate electrodes must also be increased to reduce the likelihood of encountering problems wherein the gate electrode 208A overlaps onto adjacent transistor regions. As semiconductor scaling continues, conventional patterning limitations such as these have the potential to limit the overall reliability, yield, and scalability semiconductor devices.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DETAILED DESCRIPTION

In the following detailed description, a method for electrically isolating adjacent transistors is disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

In one embodiment, semiconductor devices are fabricated by electrically isolating transistors from each other after the gate electrode patterning operation. Unlike conventional processing, which electrically isolates diffusion regions and gate electrodes at each respective patterning operation, one embodiment of the present invention forms a grid of continuous parallel gate electrode structures overlying a grid of continuous parallel diffusion regions. The grid of continuous diffusion regions and the grid of continuous gate electrode structures are perpendicular to each other. The combination of the two grids forms an overlapping array. With the exception of the masks that define the continuous diffusion regions and gate electrode structures, the etch, implant, and photo processes used to form the continuous diffusion regions and continuous gate electrode structures are conventional to one of ordinary skill.

After the continuous gate electrode structures have been formed, source/drain regions and gate electrodes have been partially formed. But, respective transistors associated with the source/drain regions and gate electrodes could not be functional since the continuous diffusion regions and continuous gate electrode structures are still interconnected. Specific circuit interconnectivity (i.e., transistor isolation) is accomplished by selectively removing specific interconnecting diffusion regions and specific interconnecting gate electrode regions. Interconnecting regions can be removed using conventional patterning and etch processing, laser ablation, focused ion beam processes, or the like. The removed material can be replaced with a dielectric material. Source/drain and gate electrode contacts can be formed either before or after interconnecting regions are removed.

Selective removal of the interconnecting diffusion regions can be done independent of the selective removal of the interconnecting gate electrode regions. Or, both the selective removal of the interconnecting diffusion region portions and the selective removal of the interconnecting gate electrode portions can be done at substantially the same time.

In alternative embodiments, instead of using both continuous gate electrode structures and continuous diffusion regions, one layer can be a continuous region or structure and the other can be a discrete region of structure. These embodiments and variations thereof may be better understood with respect to FIGS. 3-8.

Figure 3A:
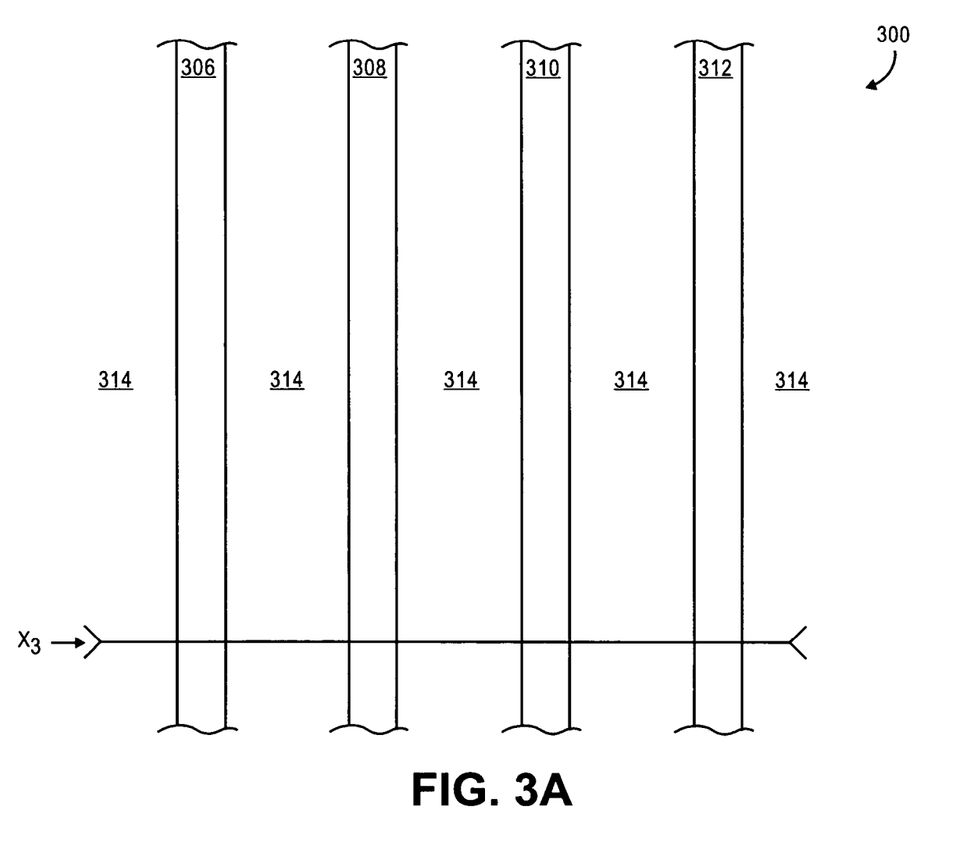
FIG. 3A illustrates a top-down view of continuous diffusion regions formed over or within a semiconductor substrate.
Figure 3B:
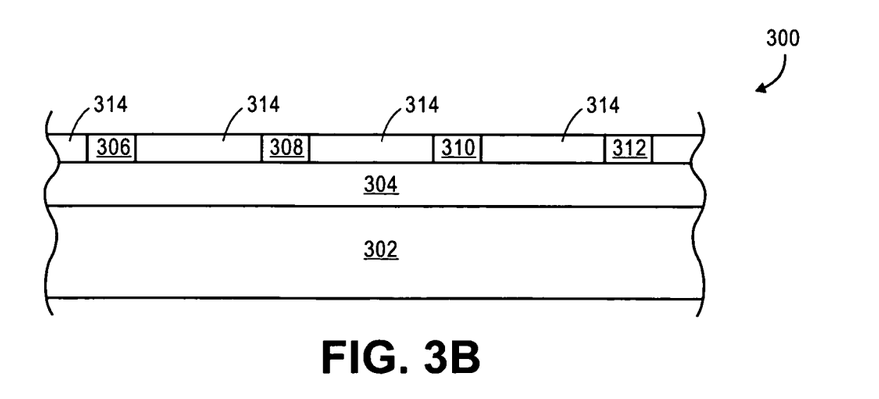
FIG. 3B illustrates a cross-section of the semiconductor substrate shown in FIG. 3.

Shown in FIGS. 3A and 3B are top-down and cross-sectional views, respectively, of a partially fabricated semiconductor device 300 formed over a substrate 302 (FIG. 2). The substrate 302 is a semiconductor wafer being processed to form an integrated circuit device, such as a microprocessor, a chipset device, a memory device, or the like. For example, the substrate can be used to form a collection of Static Random Access Memory (SRAM) devices.

Patterned diffusion regions that include regions 306, 308, 310, and 312 have been formed on or within the semiconductor substrate 302. Here, the patterned diffusion regions are separated laterally from each other via isolation regions 314. The isolation regions 314 can be formed using any number of isolation schemes, such as shallow trench isolation, local oxidation of silicon (LOCOS), or the like. The presence of isolation region 314 is not a requirement of embodiments of the present invention. However, the isolation regions 314 may improve planarity of the substrate surface and may be advantageous. In embodiments where the substrate is a silicon-on-insulator (SOI) substrate (as shown here), the isolation areas 314 can be formed overlying a buried oxide layer 304 and between the diffusion regions 306, 308, 310, and 312. In alternative SOI embodiments, where isolation 314 is not present, the substrate surface would not be planar. In this case, subsequently patterned gate electrodes would wrap around the top and sidewalls of the diffusion regions, thereby forming tri-gates or similar structures.

FIG. 3B is a cross-sectional view of the cutout X3 shown in FIG. 3A. As stated previously, FIG. 3B illustrates that in one embodiment, the isolation regions 314 and the diffusion regions 306, 308, 310, and 312 can be formed over a buried oxide layer 304 (i.e. used with an SOI substrate). However, one of ordinary skill will appreciate that embodiments of the present invention can also be used with other types of substrates, such as bulk silicon substrates, compound semiconductor substrates (i.e., gallium arsenide or indium phosphide), and the like.

Figure 4:
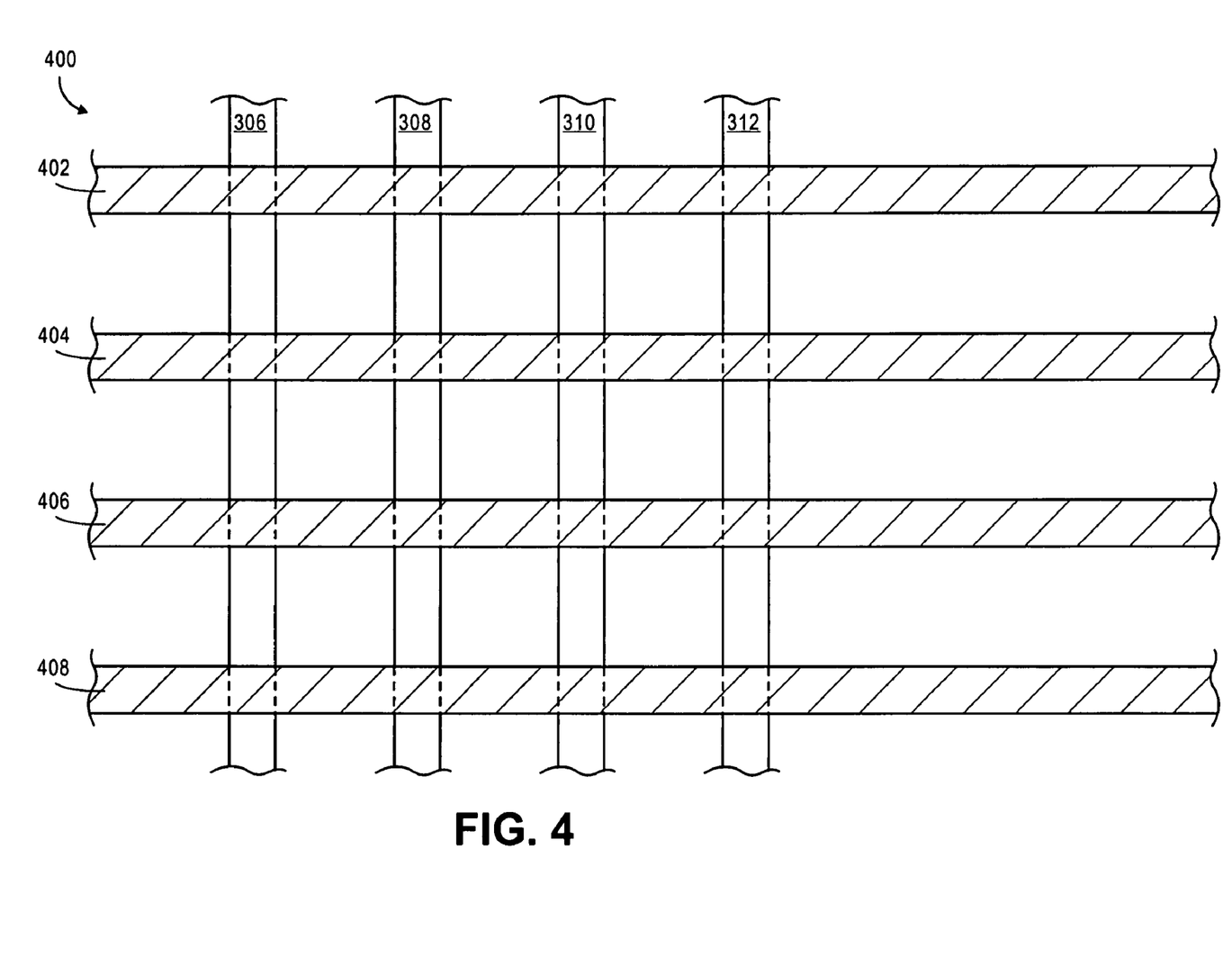
FIG. 4 illustrates a top-down view of the substrate of FIG. 3 after forming continuous gate electrode regions over the continuous diffusion regions.

FIG. 4 illustrates a top-down view of the layout for the partially fabricated semiconductor device 300 of FIG. 3A and now includes continuously patterned gate electrodes 402, 404, 406, and 408 formed over and aligned to the continuously patterned diffusion regions 306, 308, 310, and 312. Unlike the conventional patterning techniques that form discontinuous (i.e., discrete) diffusion and gate electrodes regions, the patterning technique illustrated by FIG. 4 shows the formation of continuous strips of gate electrode regions overlying continuous strips of diffusion regions. Here, the orientation of the continuous strips of gate electrode regions to the continuous strips of diffusion regions is perpendicular, and the combination thereof forms an array.

Figure 5:
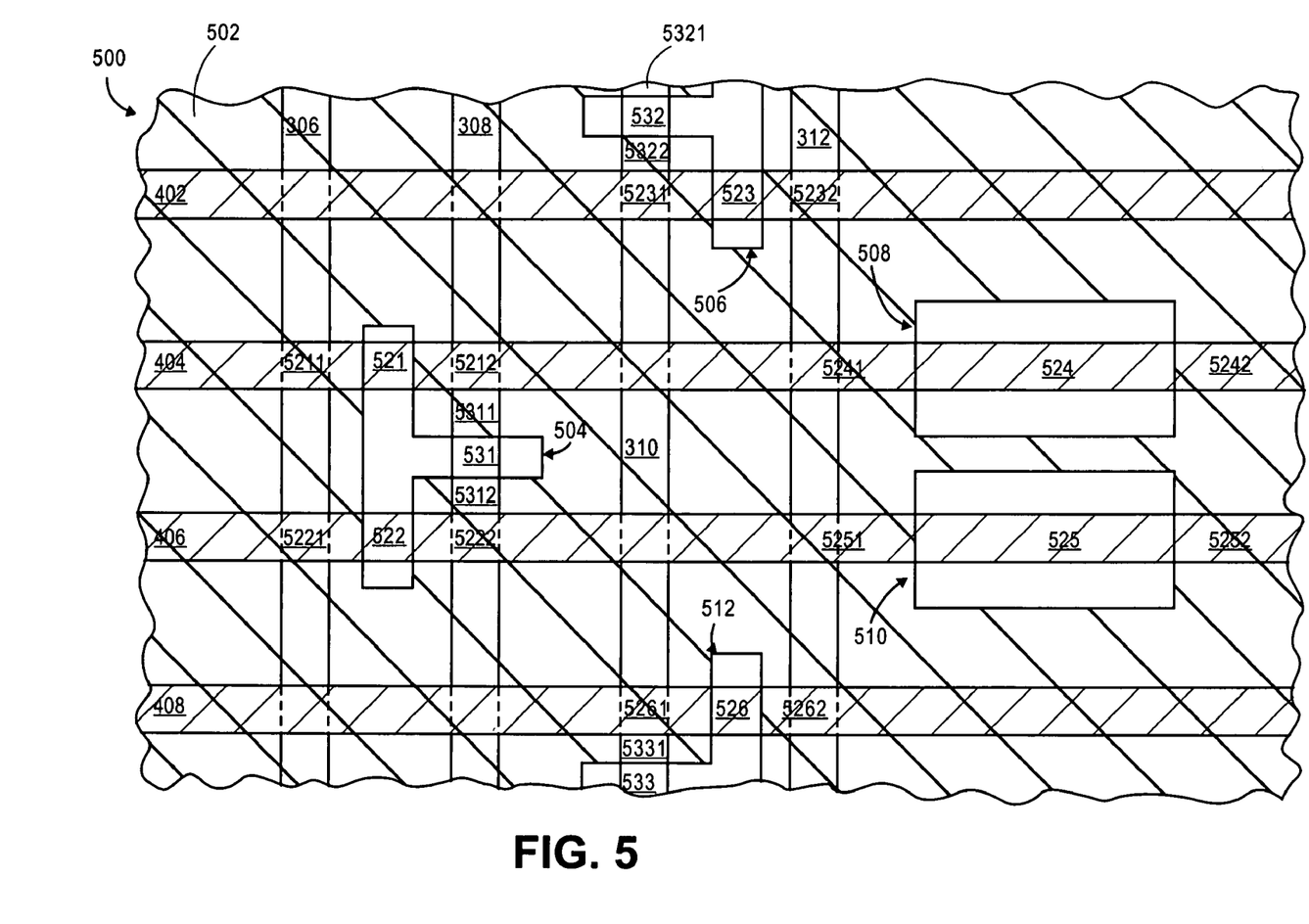
FIG. 5 illustrates a top-down view of the substrate of FIG. 4 after patterning a masking layer over the substrate.

FIG. 5A further illustrates the partially fabricated semiconductor device 400 of FIG. 4 after patterning a resist layer 502 overlying the upper surface of the substrate. The resist layer 502 has been patterned to form openings 504, 506, 508, 510 and 512. Opening 504 exposes underlying portions of continuous gate electrodes 404 and 406 and underlying portions of diffusion region 308. Opening 506 exposes underlying portions of continuous gate electrode 402 and underlying portions of diffusion region 310. Opening 512 exposes underlying portions of continuous gate electrode 408 and underlying portions of diffusion region 310. And, openings 508 and 510 expose underlying portions of continuous gate electrodes 404 and 406. For the purpose of this specification, exposes means facilitates accessibility to via some type of removal process. Therefore, exposes does not preclude the presence of an intervening layer, such as a dielectric layer, between the masking layer 502 and the underlying continuous gate electrodes and continuous diffusion regions.

After the patterned openings 504, 506, 508, 510, and 512 have been formed in resist layer 502, the exposed portions of the diffusion regions 531-533 and the exposed portions of the gate electrodes 521-526 can be removed. Removal can be accomplished using conventional etch processes. Removal of exposed diffusion region portions 531-533 and exposed gate electrode portions 521-526 forms breaks in the continuous diffusion regions and continuous gate electrode structures, thereby converting them from continuous structures to discontinuous structures. The breaks electrically isolate adjacent diffusion regions and gate electrodes from each other and thereby define the interconnectivity between transistors.

More specifically, the removal of the exposed gate electrode portion 521 electrically isolates adjacent gate electrodes 5211 and 5212. The removal of the exposed gate electrode portion 522 electrically isolates adjacent gate electrodes 5221 and 5222. The removal of the exposed gate electrode portion 523 electrically isolates adjacent gate electrodes 5231 and 5232. The removal of the exposed gate electrode portion 524 electrically isolates adjacent gate electrodes 5241 and 5242. The removal of the exposed gate electrode portion 525 electrically isolates adjacent gate electrodes 5251 and 5252. The removal of the exposed gate electrode portion 526 electrically isolates adjacent gate electrodes 5261 and 5262.

Similarly, the removal of the exposed diffusion region 531 electrically isolates adjacent diffusion regions 5311 and 5312. The removal of the exposed diffusion region 532 electrically isolates adjacent diffusion regions 5321 and 5322. And, the removal of the exposed diffusion region 533 electrically isolates adjacent diffusion regions 5331 from a diffusion region which is beyond the confines of FIG. 5 and is not shown.

Figure 6A:
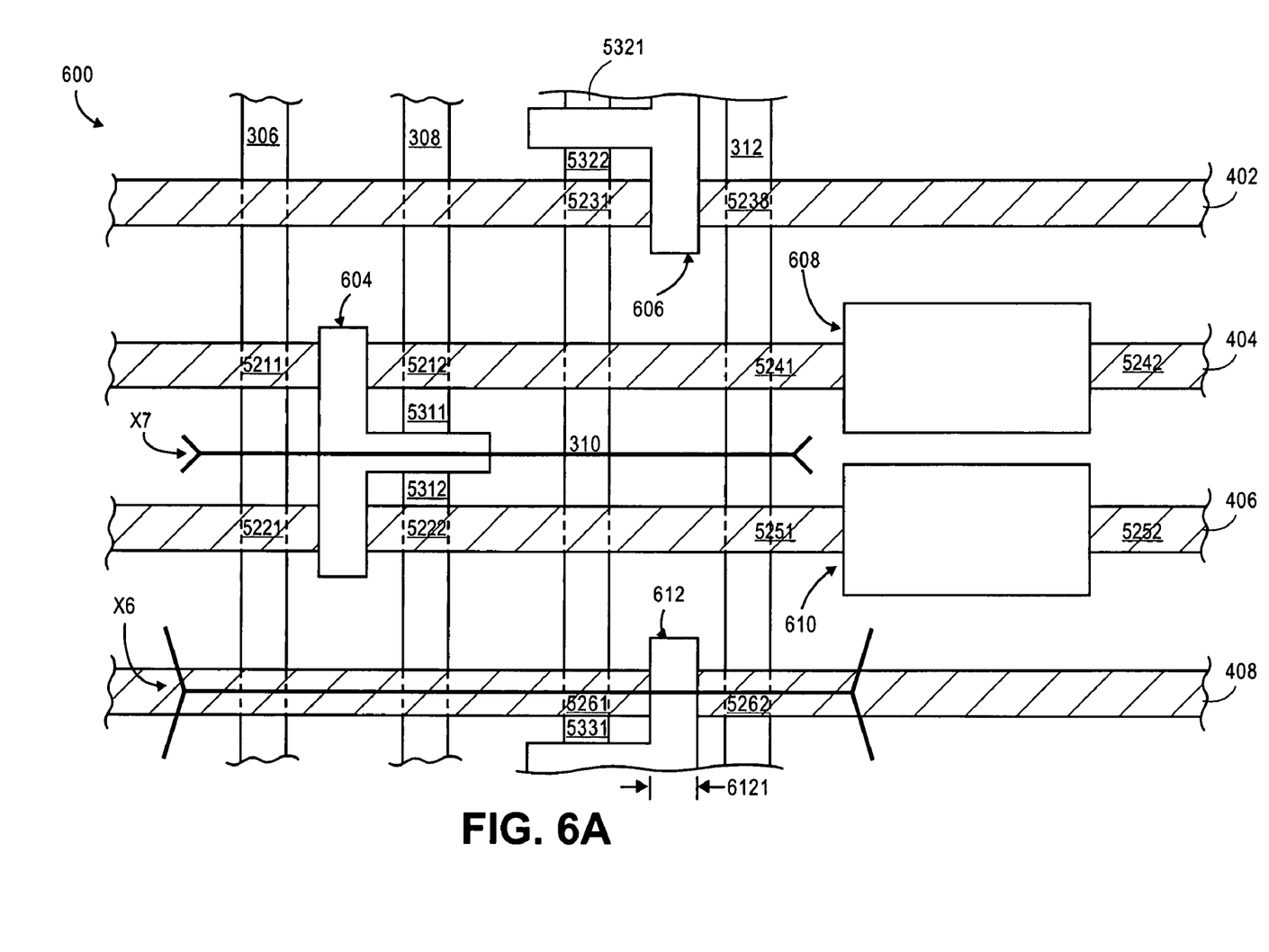
FIGS. 6A and 6B illustrate top-down and cross-sectional views, respectively, of the substrate of FIG. 4 after removing portions exposed by the patterned masking layer of FIG. 5.

FIG. 6A further illustrates the partially fabricated semiconductor device 500 of FIG. 5 after removing exposed diffusion regions 531-533 and exposed gate electrode portions 521-526 to form openings 604, 606, 608, 610, and 612. As stated previously, the openings can electrically isolate the adjacent diffusion regions from each other and adjacent gate electrodes from each other. In FIG. 6A, the masking layer 502, shown in FIG. 5, has been removed. The circuit layout defined in FIG. 6A is substantially the same as that shown in FIG. 2.

Figure 6B:
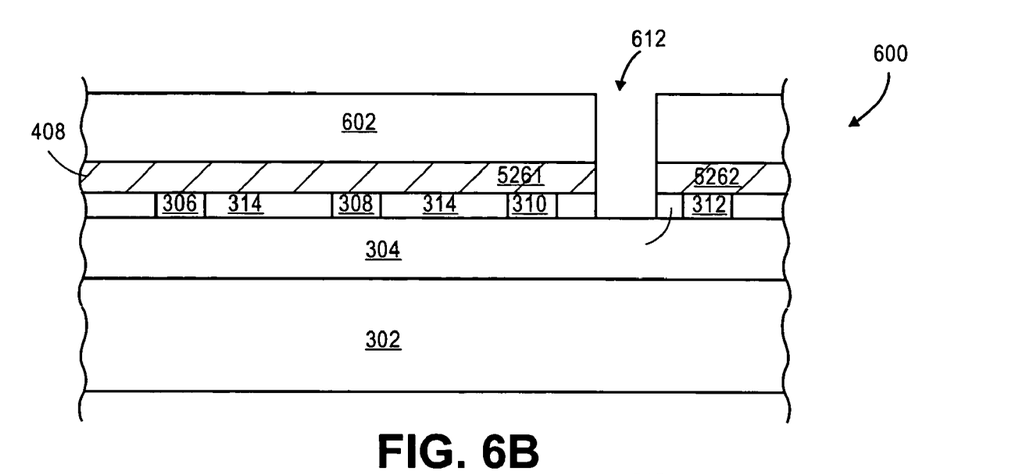

FIG. 6B is a cross sectional view of the cutout X6 shown in FIG. 6A. FIG. 6B illustrates a preferred embodiment wherein an interlevel dielectric (ILD) layer 602 is formed over the continuous diffusion regions and continuous gate electrodes prior to forming the openings 604, 606, 608, 610, and 612. One of ordinary skill appreciates that it is also possible that other intervening layers or structures can be formed between the steps of forming the structures to be isolated and forming the openings that isolate them. In this embodiment, the resist layer to form the openings was patterned on the ILD 602. In alternative embodiments, the resist layer to form the openings could have been patterned above the ILD 602 or prior to forming the ILD layer 602. As shown in FIG. 6B, the patterned opening 612 extends through the ILD layer 602, through the gate electrode material 408, and into or through the isolation region 314. The ILD layer 602 can be planarized using conventional polishing, spin-on-glass, or etch back processing prior to depositing the resist layer 502, but this is not necessarily a requirement of the present invention. However, planarizing the ILD layer improves its flatness. This may be preferable for the masking and exposure processes that pattern the openings 504, 506, 508, 510, and 512.

Figure 7A:
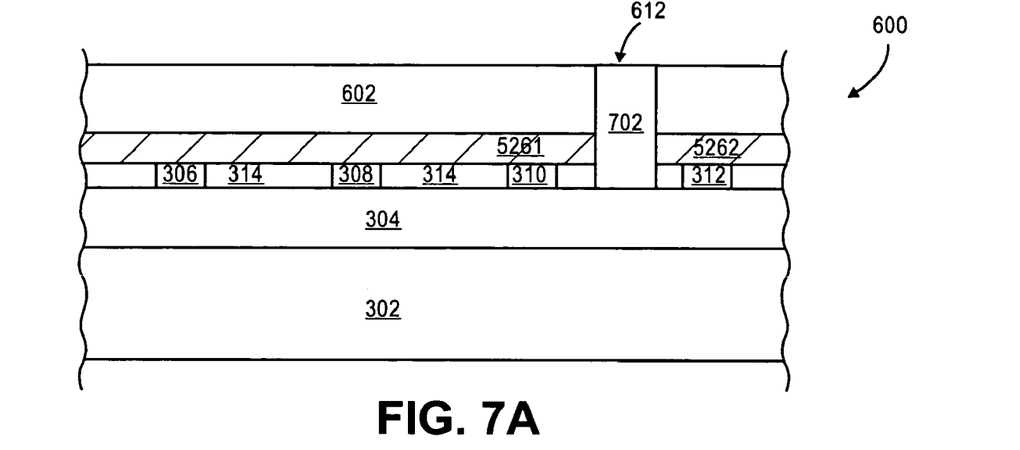
FIGS. 7A and 7B are cross-sectional views from two different perspectives of the semiconductor substrate shown in FIG. 6A after filling openings with a fill material.

FIG. 7A further illustrates the partially fabricated semiconductor device 600 of FIG. 6B after filling the opening 612, with a fill material 702. The fill material 702 can be any conventional dielectric fill material, such as for example, silicon dioxide, silicon nitride, low-k dielectrics, polyimide, or the like, and deposited using conventional deposition processes. The fill material is formed within the opening 612 and substantially fills it. Excess fill material (i.e. fill material deposited above the surface of dielectric 602) can be removed using conventional polish processing, etch back processing, or the like.

In embodiments where the patterned openings 604, 606, 608, 610, and 612 are formed prior to forming source/drain and gate electrode contacts (not shown), the fill material can have a composition that is dissimilar to, or that has an etch selectivity that is different from, the dielectric 602, which will be etched again when the source/drain and gate electrode contact openings are formed. This may improve device reliability and yield by preventing or minimizing the loss of fill material 702 in patterned openings 604, 606, 608, 610, and 612 during the subsequent contact etch. Exposure of fill material during contact etch could occur if the contact openings were to be misaligned or otherwise overlap with one of the patterned openings 604, 606, 608, 610, and 612. However, in this embodiment, to the extent that there is overlap of the contact opening and the patterned opening, the contact etch process will not substantially remove fill material. Moreover, to the extent that the fill material and the ILD layer can be etched selectively with respect to each other, the fill material may additionally function as a self-aligning structure for the etch that forms the contact opening. For example, if the ILD layer is a layer of silicon dioxide, then silicon nitride, which can be etched selectively with respect to silicon dioxide, can be used to form the fill material.

Figure 7B:
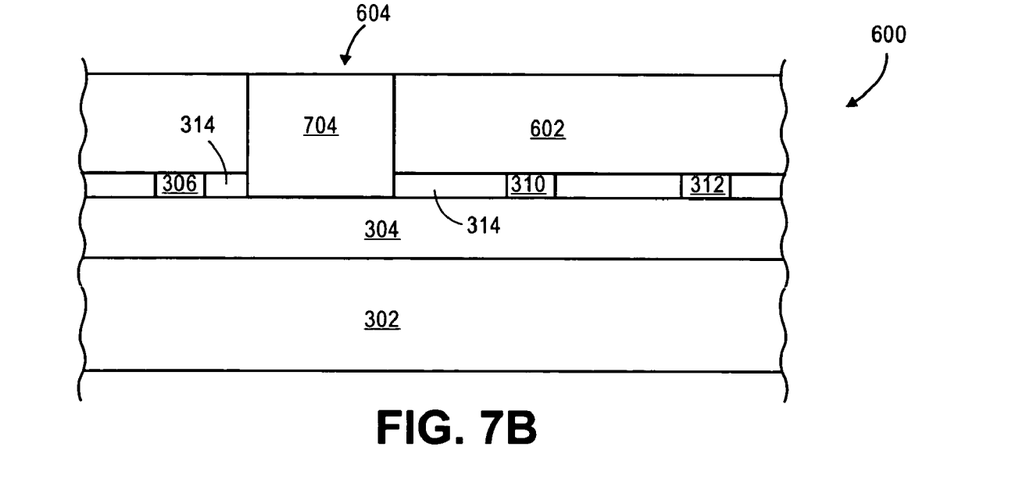

FIG. 7B illustrates a different cross-sectional view of the partially fabricated semiconductor device 600 shown in FIG. 6A after filling the opening 604 with fill material. The cross section of FIG. 7B is similar to the cross section of FIG. 7A except that the cross section of FIG. 7B is from the cutout area X7 shown in FIG. 6A. As shown in FIG. 7B, the opening 604 extends through the dielectric layer 602, through portions of isolation region 314, and through diffusion region 308 (diffusion region 308 is not shown because it has been removed by the etch to form the opening 604 in this portion of the substrate). In alternative embodiments, where substrate 302 is a bulk silicon substrate (i.e. not a silicon-on-insulator substrate), the opening 604 would only need to extend beyond the depth of the junctions of source/drain regions in order to electrically isolate them from adjacent structures.

From this point on, processing to form the semiconductor device is considered conventional to one of ordinary skill. Contacts, ILD layers, interconnects, vias, or the like, and any other structure necessary for fabrication of a semiconductor device can then all be fabricated over the semiconductor substrate to produce semiconductor circuitry.

Figure 8:
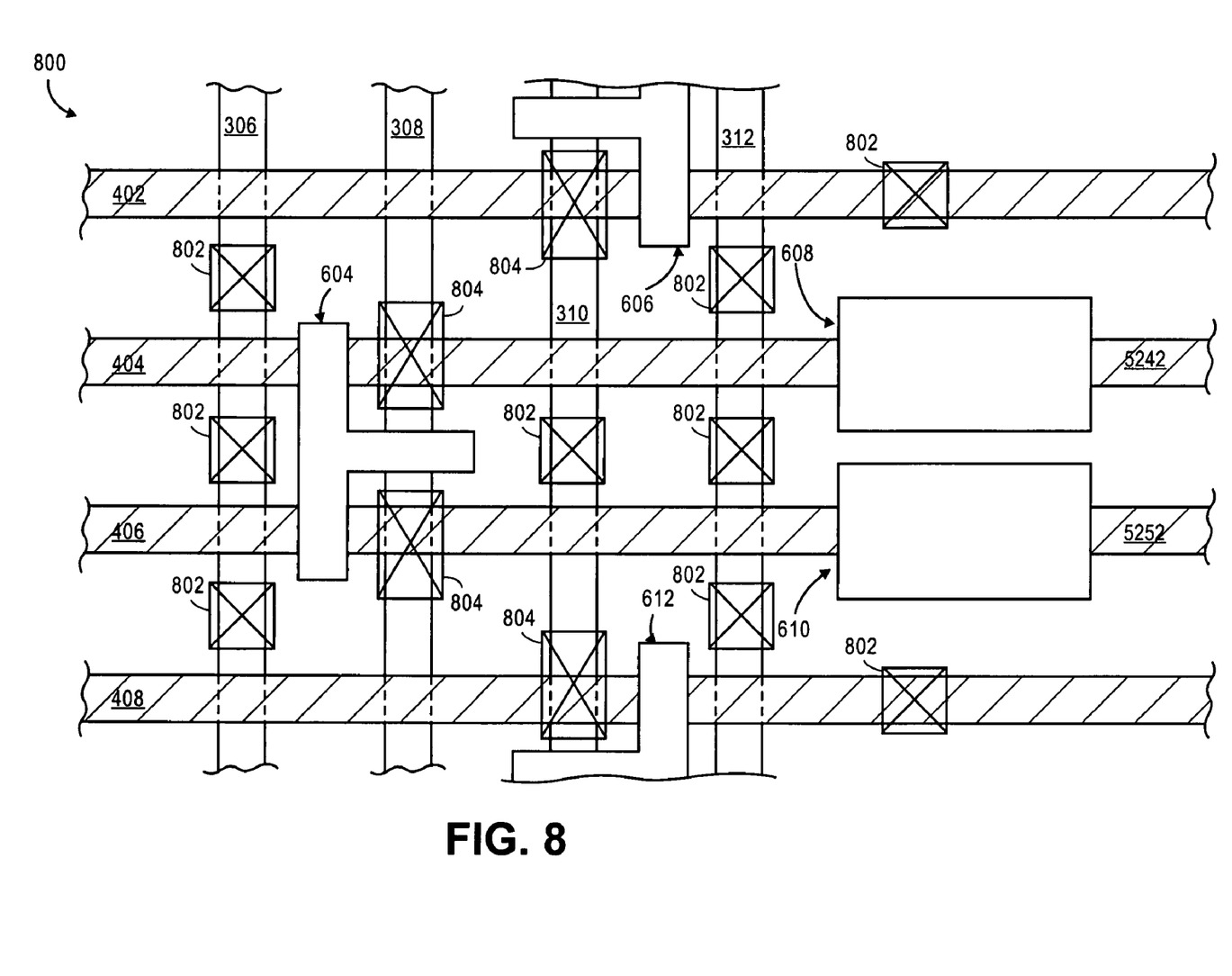
FIG. 8 is a top down view of an alternative embodiment of the present invention wherein source/drain and gate electrode contacts are formed prior to removing portions exposed by the patterned masking layer.

FIG. 8 illustrates an alternative embodiment wherein source/drain contacts 802 and trench contacts 804 are formed in the ILD layer 506 prior to patterning the openings 604, 606, 608, 610, and 612. The contacts (and trench contacts) can be formed using conventional processing. To the extent that the design rules place the contact openings in proximity to the openings 604, 606, 608, 610, and 612, this embodiment may be advantageous because the filled contact structures can improve alignment latitude by functioning as self-alignment structures for the subsequently formed openings 604, 606, 608, 610, and 612. That is, because the contacts can be filled with metal materials that may be resistant to being etched by the chemistries used to etch the ILD materials and polysilicon (i.e., fluorocarbon-based dry etch chemistries), the contact structures can be formed first. And, to the extent that there is any misalignment during subsequent processing to form the openings 604, 606, 608, 610, and 612, the contact filled structures can help reduce the effects of the misalignment.

Embodiments of the present invention are particularly useful in forming arrays of memory cells where the transistor layout is repeated over a relatively large area, such as for example, in arrays that include SRAM cells. In such arrays, scaling is critical to fabricating advanced integrated circuits (ICs). Embodiments of the present invention have advantages over conventional methods for forming transistors because they facilitate reducing layout dimensions for memory array circuitry.

For example, using embodiments of the present invention, alignment tolerances can be widened with respect to aligning the gate electrode to the diffusion regions. And, greater alignment tolerance facilitates scaling of device geometries, layout dimension, and reduced processing costs. Instead of aligning discrete gate electrode regions to discrete diffusion regions, which requires critical alignments in both the x-axis and y-axis directions, the primary consideration now becomes merely the orthogonal position of the continuous gate electrode to the continuous diffusion regions. The alignment and the critical dimensions of the patterned openings to electrically isolate the continuous sections of gate electrodes and diffusion regions is not as critical as the alignment of the discrete gate electrode portions to the discrete diffusion regions.

In addition, the array of regularly spaced gate electrode and diffusion regions provides a consistent pattern of repeating structures over the substrate. The repeating structures can reduce variations in the topography of the substrate surface. Also, chemical mechanical polishing (CMP) CMP process latitude is improved because now there is less surface topography variation and also because processing variations due to CMP macroloading and microloading effects are reduced.

In addition, embodiments of the present invention can facilitate using tighter design rules for smaller layout areas. Forming the isolation cuts (patterned openings) after forming the contact openings allows designers to use tighter design rule for a semiconductor device layout. This can be better understood with respect to comparing FIGS. 2 and 6A, which illustrate similar gate electrode and diffusion layouts, the only differences being the respective methods used to form them.

As described previously with respect to FIG. 2, one way to prevent misalignment of the poly end cap 224 to the diffusion region 112 is to make the length of the gate electrode structure 208B longer. However, in order to do this, the spacing 220 also has to be increased to prevent the possibility of encroachment of the poly end cap 224 onto regions controlled gate electrode 208A. However, using embodiments of the present invention, this problem is no longer a concern. Now, the interconnectivity between adjacent gate electrode structures 5261 and 5262 is controlled by the formation of openings 612 (shown in FIG. 6). Therefore, the amount of poly end cap overlap is now determined by the position of the opening 612 and not the alignment of the discrete gate electrode structure to the discrete diffusion region. Moreover, because the width 6121 of the opening 612 can be controlled simply by changing its dimensions on the mask, it can be scaled to accommodate existing and the device geometries and pitches in existing and future generation semiconductor devices.

One of ordinary skill appreciates that many alternative embodiments to the present invention exist, For example, instead of using both continuous gate electrode structures and continuous diffusion regions, one layer can be a continuous region or structure and the other can be a discrete region of structure. For example, where a grid of continuous gate electrode structures is formed over discrete patterned diffusion regions, specific interconnectivity can be obtained by removing only interconnecting gate electrode structure portions. Or, where discrete gate electrode structures are formed over continuous diffusion regions, specific interconnectivity can be obtained by removing specific interconnecting diffusion region portions. This could be advantageous where lithography or etch process limitations, such as tool costs or etch rate, exist. In addition, while much of the discussion herein focuses on embodiments surrounding the isolation of transistors via the removal of interconnecting diffusion regions, gate electrode portions, or both, one of ordinary skill will appreciate that the post patterning isolation methods disclosed herein can be incorporated into other front end and back end semiconductor processing steps as well. For example, instead of forming discrete metal segments using a traditional lithography process, a continuous metal line (for example a metal line used to form interconnects) can be deposited over a semiconductor device. And then, isolation cuts can be applied to specific regions of the metal line after it is formed to obtain the functional interconnectivity required for a circuit. In this way, the long metal line can be arranged to provide a density of features that can be used to improve CMP process uniformity by reducing overall topography variations, CMP microloading, and CMP macroloading effects.

While the present invention has been described with reference to various illustrative embodiments thereof, the present invention is not intended that the invention be limited to these specific embodiments. Those skilled in the art will recognize that variations and modifications can be made without departing from the spirit and scope of the invention as set forth in the appended claims. The various implementations described above have been presented by way of example only, and not limitation. Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method for forming a semiconductor device comprising:
    patterning a first conductive feature over a semiconductor substrate;
    patterning a second conductive feature over the first conductive feature;
    electrically isolating a first portion of the first conductive feature from a second portion of the first conductive feature by removing an interconnecting portion of the first conductive feature between the first portion of the first conductive feature and the second portion of the first conductive feature after patterning the second feature; and electrically isolating a first portion of the second conductive feature from a second portion of the second conductive feature by removing an interconnecting portion of the second conductive feature between the first portion of the second conductive feature and the second portion of the second conductive feature after patterning the second feature.

2. The method of claim 1, wherein removing the interconnecting portion of the second conductive feature and removing the interconnecting portion of the first conductive feature are performed during a same processing sequence.

3. The method of claim 2, wherein the same processing sequence is further characterized as an etch processing sequence.

4. The method of claim 1, wherein the first conductive feature has a first length that extends in a direction that is perpendicular to a direction of a second length of the second conductive feature.

5. The method of claim 4, wherein the first conductive feature is further characterized as a continuous diffusion region and the second conductive feature is further characterized as a continuous gate electrode structure.

6. The method of claim 5, wherein the diffusion region is further characterized as a source/drain region.

7. The method of claim 1, further comprising:
    forming an insulating layer over the second conductive feature and the first conductive feature;
    removing portions of the insulating layer to expose the interconnecting portion of the first conductive feature and the interconnecting portion of the second conductive feature;
    removing the interconnecting portion of the first conductive feature and the interconnecting portion of the second conductive feature; and
    filling openings created by removing portions of the insulating layer, the interconnecting portion of the first conductive feature, and the interconnecting portion of the second conductive feature with a dielectric material.

8. The method of claim 7 further comprising forming source/drain contacts through the insulating layer after filling the openings.

9. The method of claim 8, wherein the dielectric material is further characterized as silicon nitride.

10. The method of claim 7 further comprising forming contacts in the insulating layer prior to removing portions of the insulating layer.

11. The method of claim 1, wherein the semiconductor substrate is further characterized as a silicon-on-insulator substrate.

12. The method of claim 11, wherein the first conductive patterned feature is further characterized as a fully-depleted source/drain region.

13. A method for forming a semiconductor device comprising:
    forming a diffusion region over a semiconductor substrate;
    forming a continuous gate electrode structure over the diffusion region; and
    electrically isolating adjacent gate electrodes associated with the continuous gate electrode structure from each other after patterning the continuous gate electrode structure, wherein the diffusion region is further characterized as a continuous diffusion region and further comprising electrically isolating adjacent diffusion regions associated with the continuous diffusion region from each other after patterning the gate electrode structure.

14. The method of claim 13, further comprising:

forming an interlevel dielectric over the continuous diffusion region and continuous gate electrode structure;

removing portions of the interlevel dielectric to expose interconnecting diffusion regions between the adjacent diffusion regions and interconnecting gate electrode portions between adjacent gate electrodes;

removing exposed interconnecting diffusion regions and interconnecting gate electrode portions; and filling openings, created by removal of the interlevel dielectric, interconnecting diffusion regions, and interconnecting gate electrode portions with a second insulating layer.

15. The method of claim 14, wherein electrically isolating adjacent diffusion regions and electrically isolating adjacent gate electrodes is performed during a same processing sequence.

* * * * *